(12) United States Patent
Moronval et al.

(10) Patent No.: US 10,218,313 B2
(45) Date of Patent: Feb. 26, 2019

(54) AMPLIFIER ASSEMBLY

(71) Applicant: Ampleon Netherlands B.V., Nijmegen (NL)

(72) Inventors: Xavier Bruno Jean Moronval, Nijmegen (NL); Jean-Jacques Bouny, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 15/215,735

(22) Filed: Jul. 21, 2016

(65) Prior Publication Data

US 2017/0026001 A1    Jan. 26, 2017

(30) Foreign Application Priority Data

Jul. 22, 2015    (EP) .................................... 15290194

(51) Int. Cl.
*H03F 1/02* (2006.01)
*H03F 3/195* (2006.01)
(Continued)

(52) U.S. Cl.
CPC ........... *H03F 1/0288* (2013.01); *H01L 23/66* (2013.01); *H03F 3/195* (2013.01); *H03F 3/245* (2013.01);
(Continued)

(58) Field of Classification Search
USPC ................... 330/124 R, 295, 84, 286, 53–54
See application file for complete search history.

(56) References Cited

U.S. PATENT DOCUMENTS 7,764,120 B2 *   7/2010   Pengelly ............... H03F 1/0266
                                                  330/124 R
8,253,494 B2 *   8/2012   Blednov ............... H03F 1/0288
                                                  330/124 R
(Continued)

FOREIGN PATENT DOCUMENTS

EP          2 869 463 A1    5/2015
WO      WO 2005/031967 A1    4/2005
(Continued)

OTHER PUBLICATIONS

European Search Report issued in co-pending European Patent Application No. EP15290194, European Patent Office, dated Dec. 22, 2015, 2 pages.

*Primary Examiner* — Hieu Nguyen
(74) *Attorney, Agent, or Firm* — McDonnell Boehnen Hulbert & Berghoff LLP

(57) ABSTRACT

An amplifier assembly includes a three or more way Doherty amplifier arrangement (DAA) having at least three amplifiers, including a main amplifier and at least two peak amplifiers. The DAA is within a dual-path package including a first-RF-input-lead and a second-RF-input-lead for receiving components of a split RF-input signal and providing the components to the DAA. A first-RF-output-lead and a second-RF-output-lead receive a split output signal from the DAA. The DAA includes a first-semiconductor-die and a second-semiconductor-die, each having thereon respective amplifier(s). The first-semiconductor-die includes a Doherty-splitter element splitting the RF-input signal from the first-RF-input-lead to provide an input to two amplifiers thereon and a Doherty-combiner element to combine an output from the two amplifiers. The Doherty-combiner element is connected to the first-RF-output-lead. The second-semiconductor-die amplifier(s) are connected to the second- (Continued)

RF-input-lead to provide an input to the amplifier(s) and to the second-RF-output-lead to receive an output from the amplifier(s).

11 Claims, 3 Drawing Sheets

(51) Int. Cl.
*H01L 23/66* (2006.01)
*H03F 3/24* (2006.01)

(52) U.S. Cl.
CPC ............. *H01L 2223/6655* (2013.01); *H01L 2223/6683* (2013.01); *H03F 2200/405* (2013.01); *H03F 2200/408* (2013.01); *H03F 2200/451* (2013.01)

(56) References Cited

U.S. PATENT DOCUMENTS

| | | | | |
|---|---|---|---|---|
| 8,581,665 | B2* | 11/2013 | Ui | H03F 1/0288 |
| | | | | 330/124 R |
| 8,928,402 | B2* | 1/2015 | Gajadharsing | H03F 1/0294 |
| | | | | 330/124 R |
| 9,438,191 | B2* | 9/2016 | Blednov, IV | H03F 1/0288 |
| 2013/0196714 | A1* | 8/2013 | Yin | H01L 23/66 |
| | | | | 455/561 |

FOREIGN PATENT DOCUMENTS

| | | |
|---|---|---|
| WO | WO 2008/062371 A1 | 5/2008 |
| WO | WO 2009/031097 A1 | 3/2009 |

* cited by examiner

AMPLIFIER ASSEMBLY

CROSS-REFERENCE TO RELATED APPLICATION

This application claims priority to European Patent Application No. 15290194.8, filed Jul. 22, 2015, the contents of which is incorporated by reference herein in its entirety.

BACKGROUND

The present disclosure relates to a Doherty based amplifier assembly and to an amplifier arrangement comprising a printed circuit board and the amplifier assembly. The disclosure also relates to a method of fabricating the amplifier assembly and to an electronic device.

Doherty amplifiers are a type of amplifier that can be used for radio frequency amplification. Doherty amplifiers have found particular application in the field of mobile telecommunications and are used in the amplification of signals in GSM, WCDMA and LTE mobile telecommunication networks and in particular in cellular base stations.

SUMMARY

According to a first aspect of the present disclosure there is provided an amplifier assembly comprising a three or more way Doherty amplifier arrangement having at least three amplifiers; a main amplifier and at least two, further, peak amplifiers;
  the Doherty amplifier arrangement mounted within a dual path package having two RF input leads, comprising a first RF input lead and a second RF input lead, configured to receive component parts of a split RF input signal and to provide the component parts to the Doherty amplifier arrangement and a first RF output lead and a second RF output lead to receive a split output signal from the Doherty amplifier arrangement and provide for connection to further components;
  the Doherty amplifier arrangement comprising a first semiconductor die and a second semiconductor die, the first semiconductor die having thereon two of the at least three amplifiers and the second semiconductor die having thereon up to two of the remaining amplifier or amplifiers of the at least three amplifiers;
  wherein the first semiconductor die includes a Doherty splitter element configured to split an RF input signal received from the first RF input lead to provide an input signal to the two amplifiers thereon and a Doherty combiner element to combine an output signal from the two amplifiers thereon, the Doherty combiner element connected to the first RF output lead; and
  wherein the amplifier or amplifiers of the second semiconductor die are connected to the second RF input lead to provide an input signal to the amplifier or amplifiers and to the second RF output lead to receive an output signal from the amplifier or amplifiers of the second semiconductor die.

In one or more embodiments the amplifier arrangement may include three amplifiers for forming a 3-way Doherty amplifier, the first semiconductor die including the main amplifier and one of the peak amplifiers; and
  the second semiconductor die including a second peak amplifier.

In one or more embodiments the amplifier assembly optionally comprises a three or four way amplifier assembly. This arrangement is particularly advantageous in combination with a two RF path package or dual path package.

In one or more embodiments the amplifier arrangement optionally includes four amplifiers for forming a 4-way Doherty amplifier comprising the main amplifier and three peak amplifiers, the first semiconductor die including the main amplifier and one of the peak amplifiers; and
  the second semiconductor die including the remaining two peak amplifiers, the second semiconductor die including a Doherty splitter element configured to split an RF input signal received from the second RF input lead to provide an input signal to the two peak amplifiers thereon and a Doherty combiner element to combine an output signal from the two peak amplifiers thereon, the Doherty combiner element connected to the second RF output lead.

In one or more embodiments the 3-way Doherty amplifier is optionally of 1:2:1 type or 1.1:1 type.

In one or more embodiments the first semiconductor die optionally comprises;
  the main amplifier;
  one of the peak amplifiers;
  an output combination bar comprising the first RF output lead configured to receive and combine an output from both the main amplifier and the peak amplifier;
  a main connection configured to connect an output of the main amplifier to the combination bar, the main connection comprising, at least in part, a bond wire forming a first inductance;
  a peak connection configured to connect an output of the peak amplifier to the combination bar;
  wherein the main connection connects to the combination bar at a first point along the bar and the peak connection connects to the combination bar at a second point along the bar spaced from the first point and the main amplifier is located further from the output combination bar than the peak amplifier stage.

In one or more embodiments the first semiconductor die optionally comprises;
  a first of the peak amplifiers;
  a second of the peak amplifiers;
  an output combination bar comprising the first RF output lead configured to receive and combine an output from both the peak amplifiers;
  a first peak connection configured to connect an output of the first of the peak amplifiers to the combination bar, the first peak connection comprising, at least in part, a bond wire forming a first inductance;
  a second peak connection configured to connect an output of the second of the peak amplifiers to the combination bar;
  wherein the first peak connection connects to the combination bar at a first point along the bar and the second peak connection connects to the combination bar at a second point along the bar spaced from the first point and the first of the peak amplifiers is located further from the output combination bar than the peak second peak amplifier stage.

In one or more embodiments the first and/or second semiconductor dies optionally comprise Monolithic Microwave Integrated Circuits.

In one or more embodiments one or more of the main amplifier and the at least two peak amplifiers optionally comprise multi-stage amplifiers.

According to a second aspect of the present disclosure there is provided an amplifier arrangement comprising;
  a printed circuit board including a packaged amplifier mounted thereon, the packaged amplifier comprising the amplifier assembly of any preceding claim;

an RF input terminal connected to a splitter element configured to split an RF input signal received at the RF input terminal into at least two component parts and provide those parts to the first RF input lead and second RF input lead respectively of the packaged amplifier;

a Doherty combining element configured to combine the output signals received from the first RF output lead and the second RF output lead of the packaged amplifier and provide the combined signal to an RF output terminal.

In one or more embodiments the printed circuit board optionally includes an output impedance matching network between the Doherty combining element and the RF output terminal for matching the impedance of a load connectable to the RF output terminal.

In one or more embodiments the printed circuit board optionally includes at least one phase delay element configured to provide a phase offset between the RF input signals received by the first and second RF input leads and/or provide a phase shift between the RF output signals received from the first and second RF output leads.

According to a third aspect of the present disclosure there is provided a method for fabricating an amplifier assembly, the amplifier assembly comprising a three or more way Doherty amplifier arrangement having at least three amplifiers; a main amplifier and at least two, further, peak amplifiers comprising;

forming a dual path package having two RF input leads, comprising a first RF input lead and a second RF input lead, configured to receive component parts of a split RF input signal and to provide the component parts to a Doherty amplifier arrangement and a first RF output lead and a second RF output lead to receive a split output signal from the Doherty amplifier arrangement and provide for connection to further components, including the step of;

providing a first semiconductor die and a second semiconductor die for incorporation into the dual path package, the first semiconductor die having thereon two of the at least three amplifiers and the second semiconductor die having thereon up to two of the remaining amplifier or amplifiers of the at least three amplifiers;

connecting the first RF input lead to a Doherty splitter element of the first semiconductor die, the Doherty splitter element configured to split an RF input signal received from the first RF input lead to provide an input signal to the two amplifiers thereon and a Doherty combiner element to combine an output signal from the two amplifiers thereon, connecting the Doherty combiner element of the first semiconductor die to the first RF output lead; and connecting the amplifier or amplifiers of the second semiconductor die to the second RF input lead to provide an input signal to the amplifier or amplifiers and connecting the amplifier or amplifiers of the second semiconductor die to the second RF output lead to receive an output signal from the amplifier or amplifiers of the second semiconductor die.

According to a fourth aspect of the present disclosure there is provided an electronic device including the amplifier arrangement of the second aspect.

In one or more embodiments the electronic device optionally comprises a cellular base station.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

DETAILED DESCRIPTION

Doherty amplifiers have been found to be advantageous for their efficiency in particular applications, such as mobile base stations among others. In some examples, 3-way or 4-way (or n-way where n is greater than 5) have been shown to have advantageous efficiency parameters, such as at back-off. However, in practice, fabricating a 3 or more way Doherty amplifier in a space efficient manner is difficult. There is a demand for 3 or more way Doherty amplifiers in small cell applications in which small size is a requirement.

Figure 1:
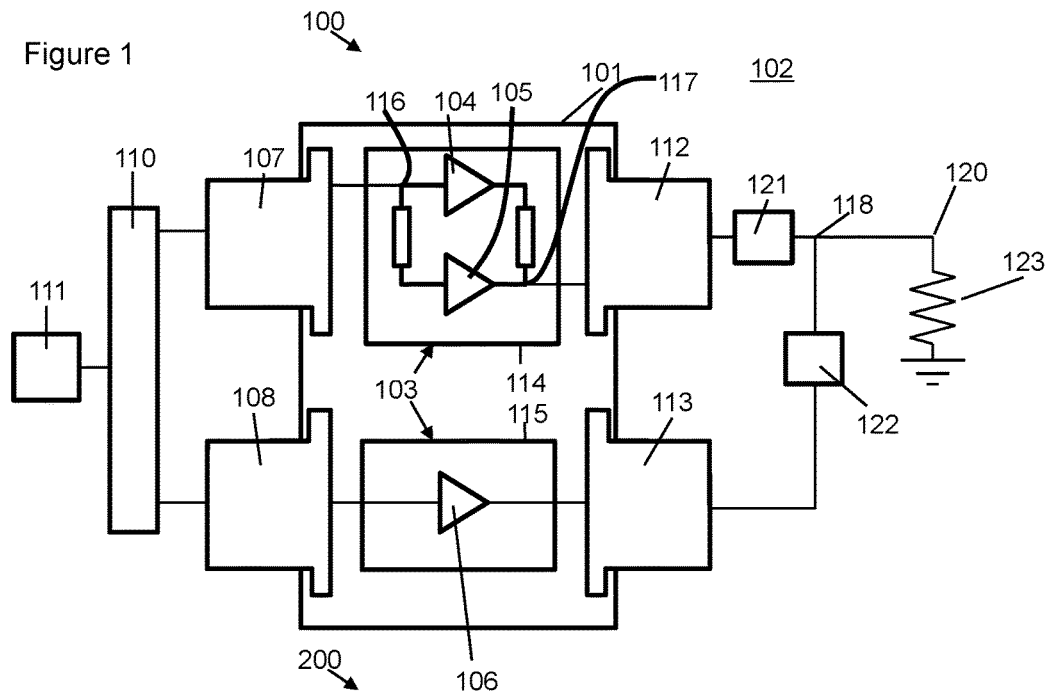
FIG. 1 shows an example embodiment of an amplifier assembly and amplifier arrangement.

FIG. 1 shows a first example Doherty amplifier assembly 100 within a dual path package 101. The packaged Doherty amplifier assembly 100 is, in this example, mounted on a printed circuit board or PCB 102 with additional Doherty amplifier related circuitry.

The assembly 100 shown in FIG. 1 comprises a three way Doherty amplifier arrangement 103 having three amplifiers comprising a main amplifier 104, a first peak amplifier 105 and a second peak amplifier 106. The dual path package has two RF input leads, comprising a first RF input lead 107 and a second RF input lead 108, configured to receive parts of a split, common RF input signal and to provide the component parts to the Doherty amplifier arrangement 103. The split RF signal is, in this example, received from a PCB mounted splitter element 110, which is configured to split an RF input signal received at an RF input terminal 111 into two RF input signals for provision to the two RF input leads 107, 108. The dual path package further comprises two output leads, comprising a first RF output lead 112 and a second RF output lead 113 to receive output signals from different amplifiers or groups of amplifiers 104, 105, 106 of the Doherty amplifier arrangement 103 and provide for connection to further components, as will be described below. Thus, the first RF input lead 107 and the first RF output lead 112 form part of a first path of the package 101 and the second RF input lead 108 and the second RF output lead 113 form part of a second path of the package thereby defining the dual path package 101 with its two RF paths therethrough.

The Doherty amplifier arrangement 103 is provided on two separate semiconductor dies within the same package 101; a first semiconductor die 114 and a second semiconductor die 115. The components of the first die 114 form part of the first path and the components of the second die form part of the second path. The first semiconductor die 114, has thereon two of the three amplifiers 104, 105, 106 comprising, in this example, the main amplifier 104 and the first peak amplifier 105. The second semiconductor die 115 has thereon the remaining amplifier, the second peak amplifier 106, in this example.

Thus, the first semiconductor die 114 provides a two way Doherty amplifier arrangement and the second semiconductor die 115 provides a one way amplifier, which together form a three way Doherty amplifier arrangement 103. In other embodiments the second die 115 may provide a two way Doherty amplifier as well as the first die 114 and therefore together the dies 114, 115 form a four way Doherty amplifier, as will be described later with reference to FIG. 2.

With reference to FIG. 1, the first semiconductor die 113 includes a Doherty splitter element 116 configured to split the (already split by splitter element 110) RF input signal received from the first RF input lead 107 to provide an input signal to the two amplifiers 104, 105 thereon and a Doherty combiner element 117 to combine output signals from the two amplifiers thereon, the Doherty combiner element configured to provide the combined signal to the first RF output lead 112.

The second peak amplifier 106 of the second semiconductor die 115 is connected to the second RF input lead 108 to provide an input signal to the second peak amplifier 106. The second peak amplifier 106 of the second semiconductor die 115 provides its output signal to the second RF output lead 113.

This arrangement is advantageous as the Doherty splitting and Doherty combining elements of two of the amplifiers (along with the amplifiers themselves) are provided on one of semiconductor dies 114 and the other semiconductor die 115 may comprise a conventional discrete amplifier 106. The combination of these two dies in a single package has been found to be highly compact. The packaged 3-way amplifier has dual path input/output making it easier to handle as the terminals 107, 108, 112, 113 may be wider for a given size of package 101 compared to a three or more path package. The splitting and combination of input and output signals for provision to and receiving from the two paths of the package may be provided external to the package on the PCB 102, as will be discussed further below. Thus, only a two-way splitter element 110 and a two way combiner element 118 is required on the PCB 102 to form, with the package 101, a three way Doherty amplifier between the RF input terminal 111 and an RF output terminal 120.

The amplifiers 104, 105 of the first semiconductor die 114 and the amplifier of the second semiconductor die may each be associated (or only one of them) with an input side matching elements (not shown). The input matching elements may form part of the first and second dies 114, 115 respectively or may be provided on the PCB 102 between the splitter element 110 and the first and second RF input leads 107, 108 respectively. The input matching elements may comprise a network of capacitances and inductances or transmission lines, as will be known to those skilled in the art. In other embodiments, the components of the first and second semiconductor dies 114, 115 may be input matched obviating the need for distinct input-side matching networks. The input matching elements may provide for phase compensation between the amplifiers 104, 105 of the first semiconductor die 114 and the amplifier of the second semiconductor die, as necessary for the arrangement of the amplifiers that form the Doherty amplifier.

Further, on an output side of the package 101, one or more output matching elements 121 may be provided on the PCB between the first and second RF output leads 112, 113 and the combiner element 118. The output matching elements may comprise a network of capacitances and inductances or transmission line(s), as will be known to those skilled in the art. Further an impedance invertor 122, which may comprise a quarter wave transmission line, may be provided adjacent the combiner element 118. The PCB 102 may also include an output impedance matching element to provide a transformation from the impedance of the 3-way amplifier to a load 123. It will be appreciated that the output impedance matching element may be located in element 121 (or a counterpart for the peak amplifier), or in between the combiner element 118 and the output load 123, or in both of the above.

This embodiment comprises a 1:2:1 type three way Doherty amplifier, although the same principles can be applied to a 1:1:1 type or other type. It will be appreciated that whether the first peak or second peak amplifier is located on the same die as the main amplifier may only have a practical implication if there is a difference in the amplification factor between the first and second peak amplifiers, as there would be in a 1:2:1 arrangement.

Figure 2:
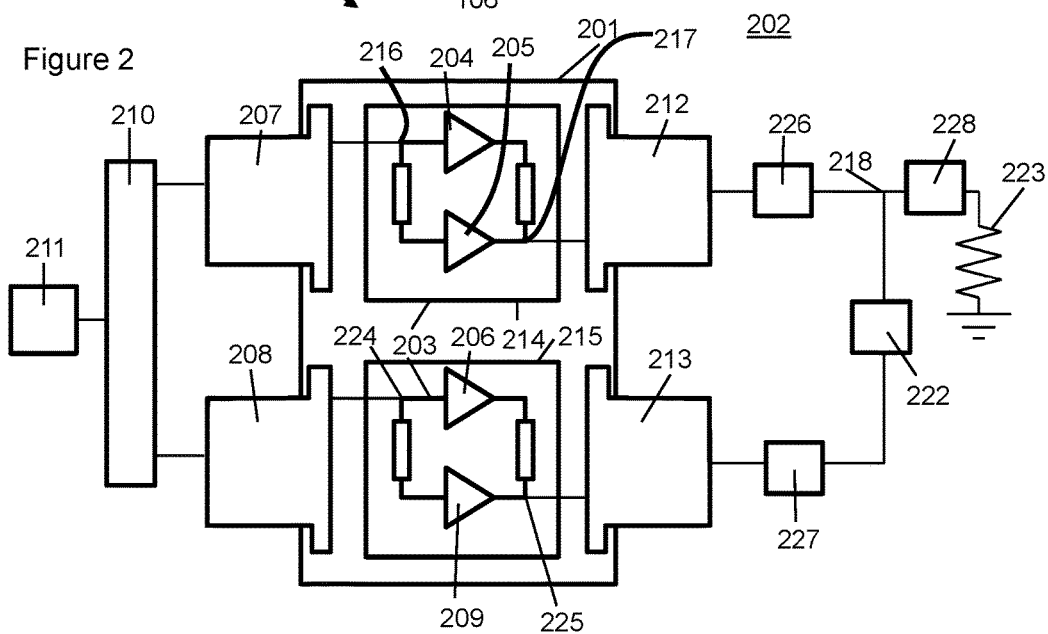
FIG. 2 shows a second example of an amplifier assembly and amplifier arrangement.

FIG. 2 shows a second example of a Doherty amplifier assembly 200 within a dual path package 201 similar to the first example of FIG. 1 and the same reference numerals have been used for like parts but increased by 100. The main difference is that the assembly 200 shown in FIG. 2 comprises a four way Doherty amplifier arrangement rather than a three way Doherty amplifier arrangement.

The four way Doherty amplifier arrangement has four amplifiers comprising a main amplifier 204, a first peak amplifier 205, a second peak amplifier 206 and a third peak amplifier 209.

Similar to the first example, the four way Doherty amplifier arrangement 203 is provided on two separate semiconductor dies within the same package 201; a first semiconductor die 214 and a second semiconductor die 215. Thus the components of the first die 214 form part of the first path and the components of the second die 215 form part of the second path. The first semiconductor die 214, has thereon two of the four amplifiers 204, 205, comprising, in this example, the main amplifier 204 and the first peak amplifier 205. The second semiconductor die 115 has thereon the remaining two amplifiers, the second peak amplifier 206 and the third peak amplifier 209, in this example.

Thus, the first semiconductor die 214 provides a two way Doherty amplifier arrangement and the second semiconductor die 215 provides a two way amplifier, which together form a four way Doherty amplifier arrangement 203.

The first semiconductor die 213 includes a Doherty splitter element 216 configured to split the (already split by splitter element 210) RF input signal received from the first RF input lead 207 to provide an input signal to the two amplifiers 204, 205 thereon and a Doherty combiner element 217 to combine output signals from the two amplifiers thereon, the Doherty combiner element configured to provide the combined signal to the first RF output lead 212. Likewise, the second semiconductor die 214 includes a Doherty splitter element 224 configured to split the (already split by splitter element 210) RF input signal received from the second RF input lead 208 to provide an input signal to the two amplifiers 206, 209 thereon and a Doherty combiner element 225 to combine output signals from the two amplifiers thereon, the Doherty combiner element 225 configured to provide the combined signal to the second RF output lead 213.

On the PCB 202, the output side includes a first output matching element 226, which may comprise a quarter wave transmission line, between the first RF output lead 212 and the combiner element 218. Further, a second output matching element 227, which may comprise a quarter wave transmission line, is provided between the second RF output lead 213 and the combiner element 218. The output matching elements 226, 227 may perform impedance matching to transform the output impedance of the first and second semiconductor dies 214, 215 to the desired value level. An impedance inverter element 222, which may comprise a quarter wave transmission line, may be provided adjacent the combiner element 218. The PCB 202 may also include an output impedance matching element 228 to provide a transformation from the impedance of the 4-way Doherty amplifier to the load 223.

Figure 3:
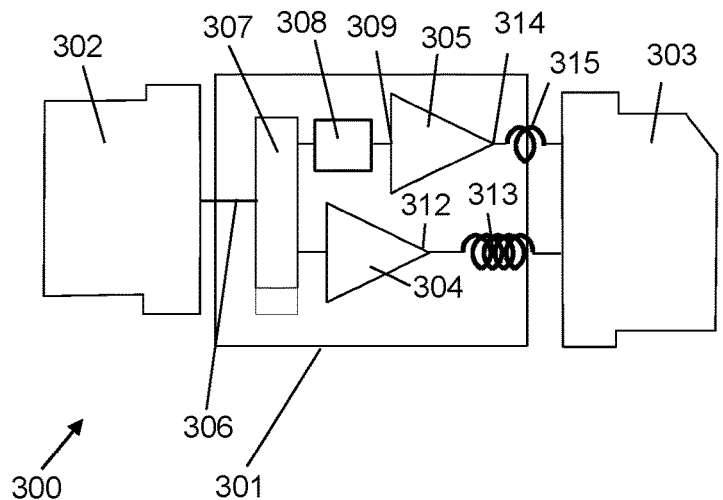
FIG. 3 shows a schematic diagram of an example of the Doherty amplifier structure of the first and or second semiconductor die.

FIG. 3 shows an example Doherty amplifier structure 300 that may be used for a semiconductor die 301, such as semiconductor die 114 of FIG. 1 or semiconductor dies 214, 215 of FIG. 2, that contains two of the three or more amplifiers that form an n-way Doherty amplifier. For example, a main and peak amplifier or a first peak and a second peak amplifier. The following example shows a main and a peak amplifier although a similar structure may be used for a peak/peak amplifier. Thus, the semiconductor die 301 may comprise the first or second semiconductor dies 114, 115, 214, 215 described above depending how the main and peak amplifiers are arranged in practice. The input lead 302 comprises the first RF input lead or the second RF input lead, which forms part of the package 101, 201 (shown in FIGS. 1 and 2) and supplies an input signal to the Doherty amplifier structure 300. The output lead 303 comprises the first RF output lead or the second RF output lead, which forms part of the package 101, 201 and comprises an output for the output signal that has been amplified by the Doherty amplifier structure 300.

The integrated Doherty amplifier structure 300 comprises the main amplifier 304 that is connected in parallel with the peak amplifier 305. The peak amplifier 305 is configured to receive an input signal that is phase delayed with respect to the input signal received by the main amplifier stage 304, as will be discussed in more detail below. The main and peak amplifiers are provided by field effect transistors or bipolar transistors and thus have source, gate and drain connections. The main and peak amplifier stages may comprise cascaded stage amplifiers including a driver transistor(s) and a final transistor.

An input splitting element 307 is configured to split the input signal from the input lead 302 to the main and peak amplifiers 304, 305. The input splitting element 307 comprises an integrated element on the die 301 and receives the input signal via a bond wire 306.

The main amplifier 304 receives an input signal directly from the input splitting element 307. An integrated, phase compensation element 308 receives the signal from the input splitting element 307 and provides a phase shifted signal to a gate 309 of the peak amplifier 305. The phase compensation element 308 may be implemented in any known manner, such as an appropriate network of capacitances and inductances. The phase compensation element 308 compensates for phase delays between the output of the main and peak amplifier stages caused by an impedance inversion arrangement, as will be described in more detail below.

The output lead 303 is arranged to receive an output from the main amplifier 304 and the peak amplifier 305. The output lead 303 forms a combination bar in the structure 300. The output 312 of the main amplifier 304 is connected to the output lead 303 by a main connection 313, formed by a bond wire. The output 314 of the peak amplifier 305 is connected to the output lead 303 by a peak connection 315, formed by a bond wire. The physical length and electrical length of the main connection 313 is greater than the physical and electrical length of each of the peak connection 315. The combination bar has a width and is orientated such relative to the main and peak amplifier that the main and peak connection bond wires can be constructed parallel to one another and combine at the combination bar at spaced locations along its width. In particular, the combination bar extends perpendicular to the bond wires that attach to it. In this embodiment, the combination bar comprises the edge of the output lead 303.

The different lengths of the main connection 313 compared to the peak connection 315 in combination with output parasitic capacitances of the main and peak amplifiers 304, 305 form an impedance inverter arrangement. The impedance inversion arrangement is tuned such that the output from the main amplifier 304 can be efficiently received at the output lead 303 when only the main amplifier stage is operating and the output of the main and peak amplifiers can be efficiently received and combined at the output lead 303.

The impedance inversion arrangement introduces approximately a 90° phase shift in the output of the main amplifier 304 and therefore the phase compensation element 308 are adapted to compensate for this phase shift. Accordingly, the output from the main amplifier 304 and the peak amplifier 305, when operating together, at high power, are combined at the output lead 303 in phase. The peak connection 315 is preferably short and therefore the output of the peak amplifier is located adjacent the die edge so that the bond wires that connect the output from the peak amplifiers to the output lead are short and introduce a small, preferably minimal, phase shift.

Further input leads may be present to connect the die 301 to other inputs required by the Doherty amplifier structure, such as to provide a gate bias and drain bias, for the main and peak amplifier stages 304, 305. Such inputs will be known to those skilled in the art.

The position of the main amplifier 304 in the die 301 relative to the peak amplifier 305 enables a longer bond wire 313 to be used. The use of the longer bond wire between the main amplifier and the combination point at the output lead is advantageous because the larger inductance of the main bond wire can be used in part to form an impedance inversion arrangement.

The above described embodiment achieves high levels of integration as the Doherty amplifier structure can be formed on a die in which the input splitting element is integrated, the phase compensation network is integrated, the amplifier stages are integrated and the impedance inversion network is formed, in part, by bond wires that also provide the connection from the die to an output lead. The locating of the main amplifier stage further from the output lead than the peak amplifier stage provides the space for the main connection bond wire to extend parallel to the peak connection bond wire while having the electrical length to implement an impedance inversion arrangement between the amplifier stages and the output lead. As the bond wires comprise the only non-integrated part of the impedance inversion arrangement, the Doherty amplifier structure is reliable to manufacture and easy to tune.

Figure 4:
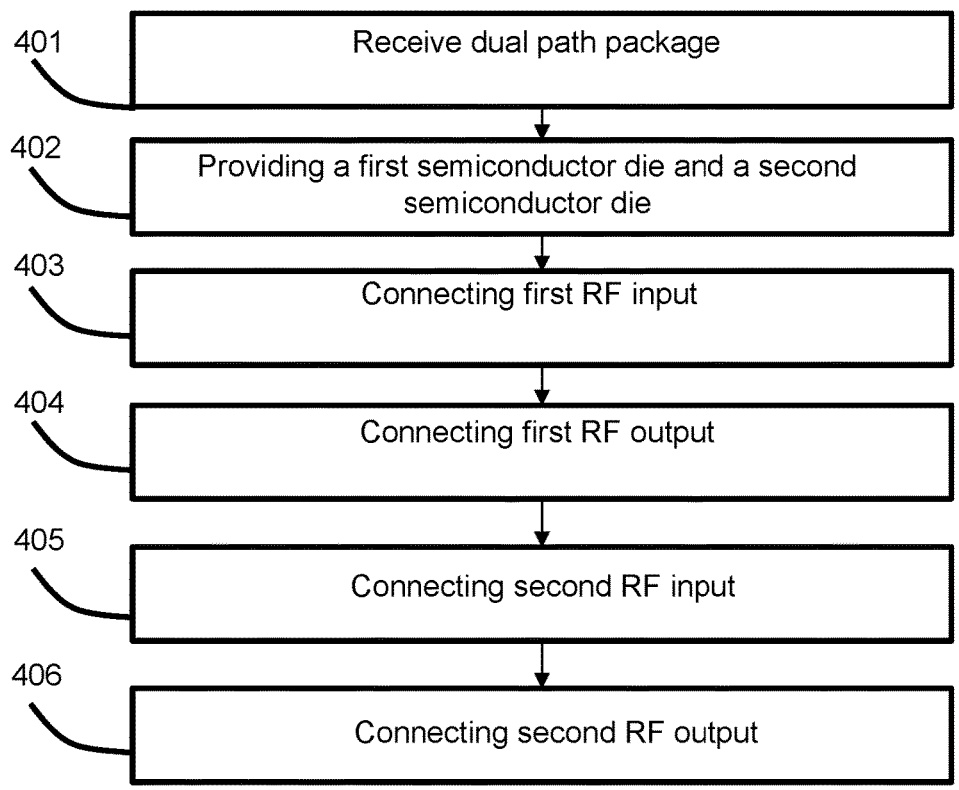
FIG. 4 shows a flow chart illustrating the steps of fabricating an example amplifier assembly.

FIG. 4 shows a flow chart illustrating an example method for fabricating an amplifier assembly. The step of forming or receiving a pre-formed dual path package having two RF input leads, comprising a first RF input lead and a second RF input lead, configured to receive component parts of a split RF input signal and to provide the component parts to a Doherty amplifier arrangement and a first RF output lead and a second RF output lead to receive a split output signal from the Doherty amplifier arrangement and provide for connection to further components is shown as step 401. The step of providing a first semiconductor die and a second semiconductor die for incorporation into the dual path package, the first semiconductor die having thereon two of the at least three amplifiers and the second semiconductor die having thereon up to two of the remaining amplifier or amplifiers of the at least three amplifiers is shown as step 402. Connecting the first RF input lead to a Doherty splitter element of the first semiconductor die, the Doherty splitter element configured to split an RF input signal received from the first RF input lead to provide an input signal to the two amplifiers thereon and a Doherty combiner element to combine an output signal from the two amplifiers thereon is shown as step 403. The step of connecting the Doherty combiner element of the first semiconductor die to the first RF output lead is shown at 404. The step of connecting the amplifier or amplifiers of the second semiconductor die to the second RF input lead to provide an input signal to the amplifier or amplifiers is shown at step 405. Connecting the amplifier or amplifiers of the second semiconductor die to the second RF output lead to receive an output signal from the amplifier or amplifiers of the second semiconductor die is shown at step 406. It will be appreciated that steps 403, 404, 405, 406 can be performed in any order.

Figure 5:
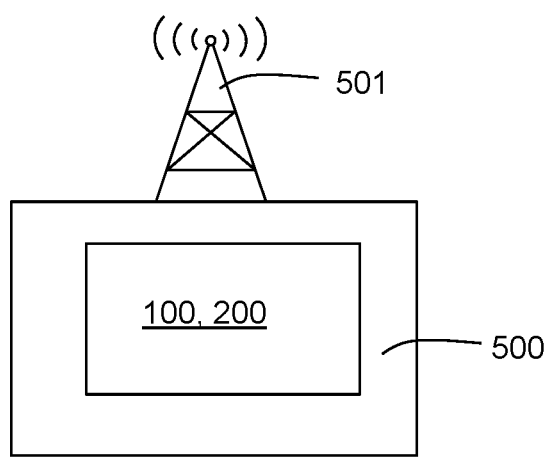
FIG. 5 shows a cellular base station of a mobile telecommunication network incorporating the Doherty amplifier structure.

FIG. 5 shows a cellular base station 500 of a mobile telecommunication network incorporating the Doherty amplifier assembly 100, 200. The Doherty amplifier assembly 100, 200 is used to amplify a signal used to drive the antenna 501.

Figure 6:
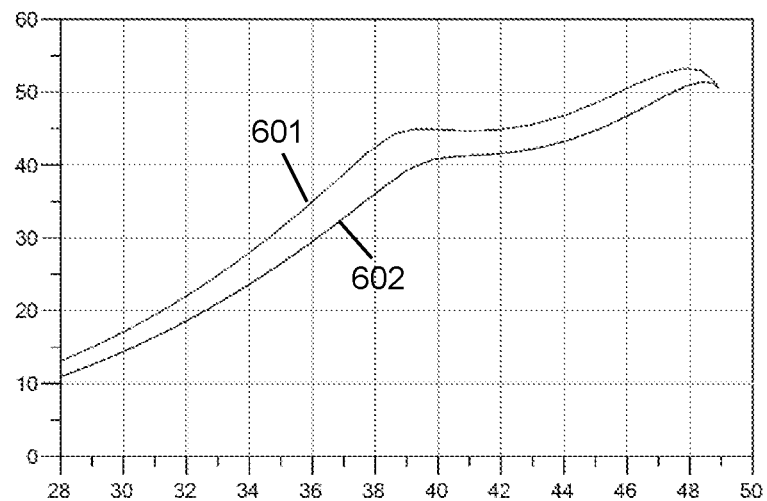
FIG. 6 shows an example graph of efficiency (%) vs. output power.

FIG. 6 shows efficiency (%) vs. output power, Pout (dBm) responses for Doherty amplifier assembly of FIG. 1, shown as line 601 and known 2:1 asymmetric MMIC of the same power capability 602.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

We claim:

1. An amplifier arrangement forming a multi-way Doherty amplifier, comprising:
   a main amplifier, a first peak amplifier, and a second peak amplifier;
   a printed circuit board comprising:
   (i) an RF input terminal;
   (ii) an RF output terminal;
   (iii) a dual path package having a first RF input lead, a second RF input lead, a first RF output lead, and a second RF output lead;
   (iv) a splitter element for splitting an RF input signal received at the RF input terminal over the first RF input lead and the second RF input lead;
   (v) a combiner element for combining signals from the first RF output lead and the second RF output lead;
   (vi) an impedance inverter arranged in between (a) one of the first RF output lead and the second RF output lead and (b) the combiner element, and (vii) a phase delay element configured to provide a phase offset between the RF input signals received by the first RF input lead and the second RF input lead;

wherein the dual path package comprises:
(i) a first semiconductor die comprising an integrated two-way Doherty amplifier that comprises a first amplifier and a second amplifier, wherein the first amplifier and the second amplifier comprise two amplifiers selected from a group consisting of: the first peak amplifier, the second amplifier, and the main amplifier, and
(ii) a second semiconductor die comprising a third amplifier, wherein the third amplifier comprises a remaining amplifier of the group of the first peak amplifier, the second amplifier, and the main amplifier, wherein the first semiconductor die comprises:
(i) a Doherty splitter element configured to split the RF input signal received from the first RF input lead to provide an input signal to the first amplifier and the second amplifier;
(ii) a phase shifting element arranged in between the Doherty splitter element and the second amplifier;
(iii) a main connection comprising a bond wire connecting an output of the first amplifier to the first RF output lead, and
(iv) a peak connection comprising a bond wire connecting an output of the second amplifier to the first RF output lead;

wherein different physical and electrical lengths of the main connection compared to the peak connection in combination with output parasitic capacitances of the first amplifier and the second amplifier form an impedance inverter arrangement, and wherein the impedance inverter arrangement introduces an approximately 90° phase shift in the output of the first amplifier, the phase shifting element being adapted to compensate for the approximately 90° phase shift.

2. The amplifier arrangement according to claim 1, wherein the first semiconductor die includes the main amplifier and one of the first peak amplifier or the second peak amplifier; and
wherein the second semiconductor die includes the other one of the first peak amplifier or the second peak amplifier.

3. The amplifier arrangement according to claim 1, further comprising a third peak amplifier,
wherein the first semiconductor die includes the main amplifier and one of: (i) the first peak amplifier, (ii) the second peak amplifier, or (iii) the third peak amplifier.

4. The amplifier arrangement according to claim 2, wherein the first amplifier, the second amplifier, and the third amplifier comprise a 3-way Doherty amplifier, and
wherein the 3-way Doherty amplifier is of 1:2:1 type or 1:1:1 type.

5. The amplifier arrangement according to claim 1, further comprising
an output combination bar receiving the bond wire of the main connection and the bond wire of the peak connection,
wherein the main connection connects to the output combination bar at a first point along the output combination bar and the peak connection connects to the output combination bar at a second point along the output combination bar spaced from the first point and the main amplifier is located further from the output combination bar than a peak amplifier stage.

6. The amplifier arrangement according to claim 1, wherein at least one of the first semiconductor die or the second semiconductor die comprises Monolithic Microwave Integrated Circuits.

7. The amplifier arrangement according to claim 1, wherein one or more of the main amplifier, the first peak amplifier, and the second peak amplifier comprise multi-stage amplifiers.

8. The amplifier arrangement according to claim 1, wherein the printed circuit board includes an output impedance matching network between a first Doherty combining element and the RF output terminal for matching an impedance of a load connectable to the RF output terminal.

9. The amplifier arrangement according to claim 1, wherein the phase delay element is configured to provide a phase shift between the RF output signals received from the first RF output lead and the second RF output lead.

10. An electronic device including the amplifier arrangement of claim 1.

11. An electronic device of claim 10, wherein the electronic device comprises a cellular base station.

* * * * *